US006205219B1

United States Patent
Hollenbach et al.

(10) Patent No.: US 6,205,219 B1
(45) Date of Patent: Mar. 20, 2001

(54) CALL RELATED INFORMATION RECEPTION USING SIGMA/DELTA MODULATION

(75) Inventors: Keith Eugene Hollenbach, Kutztown; Donald Raymond Laturell, Upper Macungie; Steven Brooke Witmer, Sinking Spring, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/028,478

(22) Filed: Feb. 24, 1998

(51) Int. Cl.$^7$ .................................................. H04M 19/00
(52) U.S. Cl. ...................... 379/413; 379/93.1; 379/93.36
(58) Field of Search .............................. 379/93.01, 93.06, 379/93.03, 93.15, 93.28, 93.36, 413; 375/247, 334

(56) References Cited

U.S. PATENT DOCUMENTS

| | | | |
|---|---|---|---|
| 4,851,841 | * 7/1989 | Sooch | 341/143 |
| 4,852,152 | * 7/1989 | Honick | 379/97 |
| 5,086,454 | * 2/1992 | Hirzel | 379/98 |
| 5,189,419 | * 2/1993 | Lyden | 341/143 |
| 5,369,687 | * 11/1994 | Farkas | 379/98 |
| 5,875,235 | * 2/1999 | Mohajeri | 379/93.36 |
| 5,940,019 | * 8/1999 | Maejima | 341/143 |

OTHER PUBLICATIONS

Boser et al.; Quantization Error Spectrum of Sigma–delta Modulators; ISCAS 1988, pp. 2331–2334, 1988.*
Comino et al.; A First–Order Current–Steering Sigma–Delta Modulator; IEEE 1991; pp. 176–183, 1991.*
Yu et al.; Adaptive quantisation for one–bit sigma–delta modulation; IEEE Preceedings–G, vol. 139, No. 1, pp. 39–44, Feb. 1992.*
Jansson; A High–Resolution, Compact, and Low–Power ADC Suitable for Array Implimentation in Standard CMOS; IEEE 1995; pp. 904–912, 1995.*
Kiriaki; A 0.25 mW Sigma–Delta Modulator for Voice–band Applications; 1995 Symposium on VLSI Circuits Digest of Technical Papers; pp. 35–36, 1995.*
Analog Devices et al., "Audio Codec '97; Component Specification; Revision 1.03; Sep. 15, 1996", Sep. 15, 1997.
Intel Corporation, "Audio Codec '97; Revision 2.0, Sep. 29, 1997", Sep. 29, 1997.

* cited by examiner

*Primary Examiner*—David R. Hudspeth
*Assistant Examiner*—Abul K. Azad
(74) *Attorney, Agent, or Firm*—William H. Bollman

(57) ABSTRACT

A method and apparatus to receive and demodulate call related information, e.g., Caller ID information, in an audio codec placed on the line side and powered by current drawn from the telephone line. The audio codec includes a $1^{st}$ order $\Sigma/\Delta$ A/D converter to digitize the signal from the telephone line with $\Sigma/\Delta$ modulation. The $1^{st}$ order $\Sigma/\Delta$ A/D converter may be a scaleable component capable of alternative operation in a $2^{nd}$ order. The $\Sigma/\Delta$ encoded digitized signal is digitally processed by a DSP including an amplifier module, a digital filter, a limit/slice module, and an FSK decoder to receive and output the call related information. Placement of the audio codec on the line side and the scaleable $\Sigma/\Delta$ A/D converter provides significantly reduced power requirements for the audio codec, thus allowing operation from power derived from the telephone line. In another embodiment, to further reduce power consumption of the audio codec, the $1^{st}$ order $\Sigma/\Delta$ A/D converter is sampled at a slower rate than is conventional, e.g., by first dividing or otherwise providing a slower sampling clock.

34 Claims, 6 Drawing Sheets

CALL RELATED INFORMATION RECEPTION USING SIGMA/DELTA MODULATION

BACKGROUND OF THE INVENTION

1. Field of the Invention

This invention relates to a receiver for information transmitted on a telephone line. More particularly, it relates to the reception of call related information, e.g., Caller ID information, on a line side using an audio codec.

2. Background of Related Art

The reception of call related information before answering an incoming call is known. For instance, one call related information service is called Calling Identity Delivery (Caller ID), which is a well known and popular service provided by many telephone companies. This service provides the telephone number and household name information of a calling party to the called party before the call is answered. Based on a display of the Caller ID information, the called party may decide not to answer the incoming call. Basic Caller ID information is transmitted from the local telephone company to the called party while the called party's phone is in a hung-up or on-hook state, between the first and second rings. Customer premises equipment capable of receiving Caller ID (CID) information including Calling Number Delivery (CND) and Calling Name Delivery (CNAM) when the customer premises equipment is on-hook is generally referred to as Type 1 customer premises equipment.

Waveform (a) of FIG. 6 depicts the signal on a telephone line including Caller ID information transmitted from a central office to customer premises equipment. As depicted, the Caller ID information is transmitted to the customer premises equipment as marks and spaces between a first and second ring signal. Waveform (b) of FIG. 6 shows the approximate current draw allowed by customer premises equipment from a telephone line while the customer premises equipment is on-hook or hung-up, according to current standards in the United States. Although the customer premises equipment is permitted to draw additional power from the telephone line approximately during and between the first and second ring signals while the customer premises equipment is on-hook, even this additional power is extremely limited both in amplitude and in duration. Moreover, although customer premises equipment is permitted to draw significantly more power while in an off-hook condition, Type 1 Caller ID information is received entirely while the customer premises equipment is on-hook. Because of the limited amount of current available from the telephone line while the customer premises equipment is in an on-hook state, most devices which receive Caller ID information are either powered by an external power source, or are generally non-linear analog circuits.

Conventional circuits exist for receiving call related information on a line side of a telephone circuit. For instance, FIG. 7 shows a conventional analog circuit for receiving call related information, e.g., Caller ID.

In FIG. 7, call related information is coupled through capacitors 702, 704 and transformer T1 even when the on-hook switch 706 is open. Ring signals are detected by opto-isolator OPTO1. The circuit of FIG. 7 is entirely analog. Isolation between the high voltage, line side of the circuit (the right side in FIG. 7) and the low voltage side of the circuit (the left side in FIG. 7) is provided by transformer T1.

FIG. 8 shows another conventional circuit for receiving call related information. In FIG. 8, the circuit for receiving the call related information, e.g., Caller ID, is an analog circuit separated from the main signal path of the telephone circuit. The call related information signal path is isolated by isolation capacitors 808, 810, and differentially input to an operational amplifier (op amp) 820 via resistors 804, 806. The output of the op amp 820 is input to a codec 830, which digitizes the signal for processing by the digital signal processor (DSP) 840.

In FIG. 8 the call related information circuit is an analog circuit with the codec 830 being on the low voltage side of isolation capacitors 808, 810. The codec 830 is powered by an external source in the conventional circuit of FIG. 8. Moreover, ring signals may be detected either by the opto-isolator 708 or through the call related information signal path.

Call related information receiving circuits such as those shown in FIGS. 7 and 8 require extra circuits or require that an audio codec, e.g., 730 (FIG. 7) and 830 (FIG. 8), be in a powered-on condition which is wasteful. For example, a call related information device may be battery or line powered, relocated easily from place to place, and installed in any convenient telephone jack. For convenience purposes it may be desirable to not provide the call related information device with an external power source. Thus, in these type situations, extra circuits or audio codecs may be wasteful of available battery or line power.

Similarly, FIG. 9 shows yet another conventional circuit for receiving call related information that requires extra circuits. In FIG. 9, the circuit for receiving call related information is a digital circuit separated from the main signal path of the telephone circuit.

In particular, as shown in FIG. 9, a tip signal T and a ring signal R from a telephone line are input to a filter 918 and an analog amplifier 916, which amplifies the analog signal including the call related information from the telephone line. The output of the analog amplifier 916 is input to a limit/slice circuit 914, which forms a digital signal for processing by the OOK modulator 912. The OOK modulator 912 provides on-off keying at the FSK rate to pass the call related information to the DSP 940 through isolation capacitors 902, 904. The DSP 940 includes an FSK decode module to decode the call related information and output the call related information, e.g., Caller ID data including CND and CNAM, for storage in log memory and/or for display.

In FIG. 9, the codec 930 remains on the low voltage side of the telephone circuit, i.e., isolated from the telephone line, in this case by isolation capacitors 902, 904 and transformer T1. The codec 930 is powered by an external source, and is not in the path of reception of call related information. Ring signals may be detected either by the opto-isolator 708 or through the call related information signal path, but in either case amplitude information with respect to the ring signal is not detected.

There is a need for low power elements allowing processing in a digital call related information signal path on a high voltage side of a telephone circuit.

SUMMARY OF THE INVENTION

In accordance with the principles of the present invention, a line-powered device receives data from a telephone line in an on-hook state. The device includes a line-powered $1^{st}$ order or other very low power codec sigma-delta analog-to-digital converter which digitizes an analog signal from the telephone line to digital samples. A digital filter filters the digital samples output from the first order sigma-delta analog-to-digital converter, and a line-powered frequency shift keying decoder decodes a filtered signal from the filtered digital signal, and outputs decoded data.

A method is also disclosed for receiving data from a telephone line in an on-hook state. An analog signal from a telephone line is digitized using a line-powered $1^{st}$ order sigma-delta analog-to-digital converter. The data is digitally decoded from an output of the $1^{st}$ order sigma-delta analog-to-digital converter, and decoded data is provided.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides an audio codec capable of operation on the high voltage, line side of a telephone circuit, i.e., before the isolation circuitry. Placement of an audio codec, capable of digitally processing and demodulating call related information, on the line side improves the reception of call related information, e.g., Caller ID, reduces costs over conventional circuitry, and allows reception of call related information using line power.

A codec (short for COder-DECoder) is an integrated circuit or other electronic device which combines the circuits needed to convert analog signals to and from Pulse Code Modulation (PCM) digital signals. Early codecs converted analog signals at an 8 KHz rate into 8-bit PCM for use in telephony. More recently, the efficiency and low cost advantages of codecs have been expanded to convert analog signals at a 48 KHz sampling rate into 16-bit stereo (and even up to 20-bit stereo) for higher quality use beyond that required for telephony. With higher quality audio capability, today's codecs find practical application in consumer stereo equipment including personal computers (PCs), CD players, modems and digital speakers.

Improved signal-to-noise (S/N) ratios have been achieved largely by separating the conventional codec into two individual sub-systems and/or two separate integrated circuits (ICs): a controller sub-system handling primarily the digital interface to a host processor, and an analog sub-system handling primarily the interface to, mixing and conversion of analog signals. This split digital/analog architecture has been documented as the "Audio Codec '97 Component Specification", Revision 1.03, Sep. 15, 1996, most recently revised in "Audio Codec '97", Revision 2.0, Intel Corporation, Sep. 29, 1997 (collectively referred to herein as "the AC '97 specification"). The embodiments disclosed herein include audio codecs which conform to the AC '97 specification. The documents comprising the AC '97 specification in their entirety are expressly incorporated herein by reference.

Figure 1:
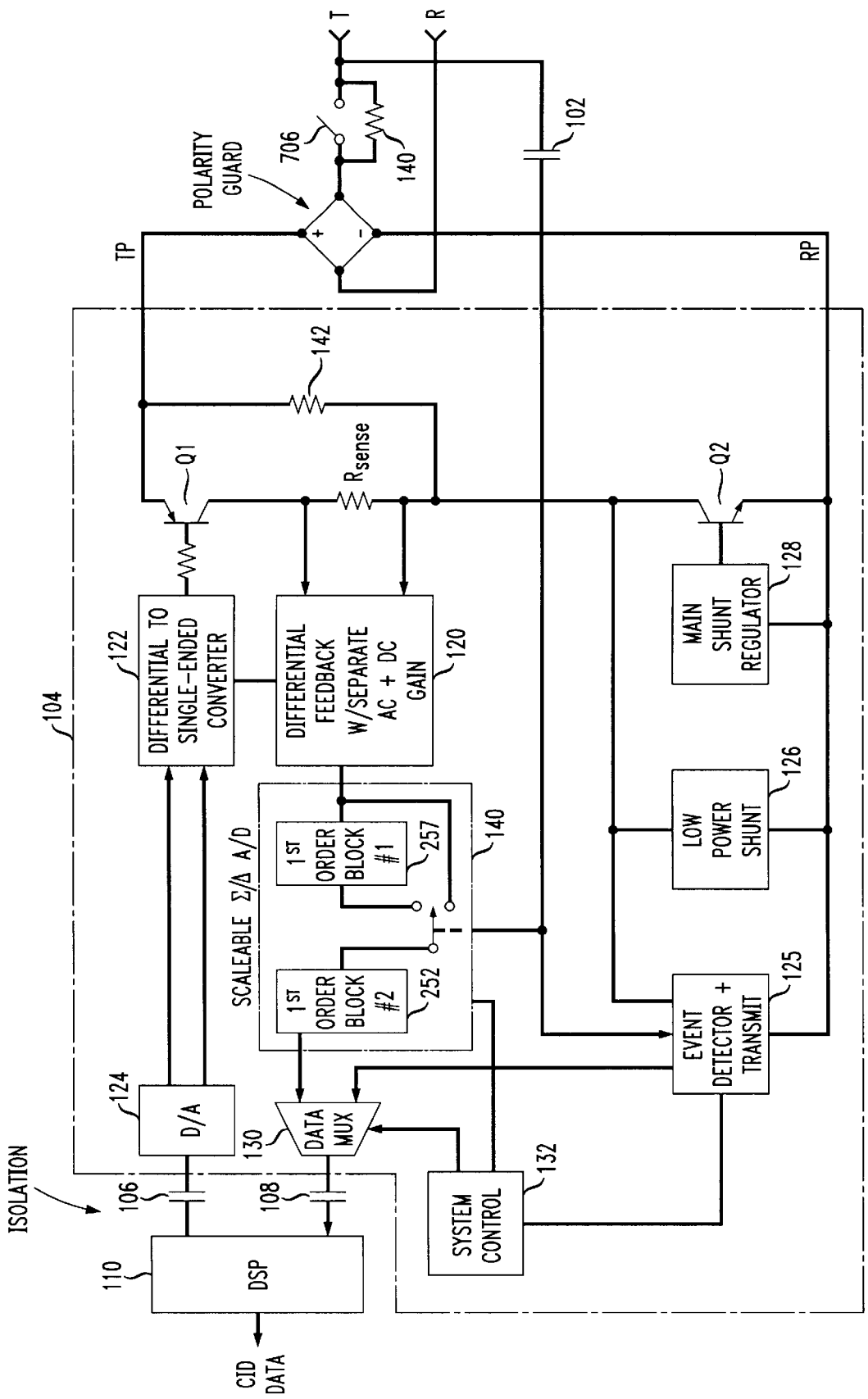
FIG. 1 shows a telephone circuit including a low power digital call related information signal path combined with a main signal path on the high voltage side of a telephone circuit in accordance with the principles of the present invention.

FIG. 1 shows relevant portions of an audio codec 104 placed on the line side in accordance with the principles of the present invention. The inventive audio codec 104 is a delta-sigma ($\Sigma/\Delta$) audio codec having scaleable order, e.g., in an analog-to-digital (A/D) converter, to allow operation in a reduced power mode, e.g., for operation using power drawn from the telephone line.

In FIG. 1, a tip signal T and a ring signal R are each input to a polarity guard circuit, which provides a tip polarity signal TP and a ring polarity signal RP to the audio codec 104. An on-hook switch 706 indicates an on-hook condition when open. A resistor 140 (e.g., 4.7 megaohms) placed across the on-hook switch 706 provides current draw on the telephone line even when the customer premises equipment including the scaleable audio codec 104 is in an off hook condition, i.e., when switch 706 is closed. A capacitively coupled event signal comprising the tip signal T is input to an event detector and transmitter 125 inside the scaleable audio codec 104 for detection of signal activity on the telephone line. The scaleable audio codec 104 is placed into one of a plurality of power modes depending upon the on-hook/off-hook condition of the customer premises equipment and/or whether the customer premises equipment is receiving a ring signal or call related information, e.g., Caller ID information.

The output of the scaleable audio codec 104 is presented to a digital signal processor (DSP) 110 for processing and output of the call related information, e.g., Caller ID information to a display. For off-hook operation, a digital signal from the DSP 110 is input to a digital-to-analog converter 124 in the scaleable audio codec 104. The DSP 110 is isolated from the line side by isolation capacitors 106, 108.

The audio codec 104 in the disclosed embodiment is capable of three reduced power modes which reduce power requirements and allow operation within the acceptable limits of applicable regulatory requirements. For instance, in one reduced power mode, the customer premises equipment is in an on-hook condition with no activity on the telephone line. In another reduced power mode using slightly more power the event detector and transmitter 125 senses signaling activity on the telephone line. In the first or both of these reduced power modes the scaleable $\Sigma/\Delta$ A/D converter 140 may be unpowered. In a third reduced power mode, the presence of call related information is detected by event detector and transmitter 125, which upon detection initiates a power-up sequence in the Σ/Δ A/D converter 140 into a $1^{st}$ order mode through the system control module 132.

In normal operation in an off-hook condition, the Σ/Δ A/D converter 140 is powered up in a higher order mode, e.g., a $2^{nd}$ order mode, which typically requires that external power be drawn. The $2^{nd}$ order mode is a more typical mode of operation of the Σ/Δ A/D converter 140, and relates to normal operation mode of the Σ/Δ A/D converter 140 wherein an audio signal such as from a CD player or from a conversation on a telephone are digitized. Operation of the A/D converter 140 in the $1^{st}$ order mode, while decreasing signal-to-noise (S/N) ratio performance, provides low and undesirable performance for digitization of audio signals, but decreases significantly the power requirements of the scaleable audio codec 104 for non-audio signal applications such as for the reception of call related information.

In the disclosed embodiment, the scaleable Σ/Δ A/D converter 140 is operable in either a $1^{st}$ order mode for detection of call related information, or in a $2^{nd}$ order mode for normal, high power operation in an off-hook condition. While providing a lowered S/N ratio, it is found that $1^{st}$ order operation is nevertheless sufficient to receive call related information, e.g., Caller ID information, with digital processing on a line side. Thus, the scaleable audio codec 104 can receive call related information, e.g., Caller ID information, or a ring signal, while being powered by the telephone line.

The scaleable audio codec 104 further includes a main shunt regulator 128 for normal operation, i.e., when in an off-hook condition, which is shut off in a reduced or low power mode of operation of the scaleable audio codec 104. A low power shunt 126 receives power from power from a resistor 142. The scaleable audio codec 104 includes a differential to single-ended converter from the D/A converter 124 to a transistor Q1 to modulate the telephone line with a signal from the DSP 110 in normal operation, i.e., when not in an on-hook condition. The transistor Q1, differential to single-ended converter module 122, the differential feedback with separate AC and DC gain module 120, the D/A converter 124 and the main shunt regulator 128 are unpowered in a reduced power mode of the audio codec. An event detector and transmitter 125 detects reception of call related information and/or a ring signal on the telephone line when the scaleable audio codec 104 is in a low power mode and the customer premises equipment is in an on-hook condition. A sense resistor Rsense provides signals on the telephone line to the scaleable Σ/Δ A/D converter 140 through a differential feedback circuit 120 having separate AC and DC gain. A multiplexer (MUX) 130 outputs to the DSP 110 either the digitized signals from the scaleable Σ/Δ A/D converter 140, or the event detector and transmitter 125, based upon selection by a system control module 132. Possible signals from the event detector and transmitter 125 include a signal corresponding to a ring signal.

In accordance with the principles of the present invention, the scaleable audio codec 104 is operable in multiple power modes, e.g., a normal, high power mode wherein full capabilities of an audio codec are available, and other low power modes wherein the scaleable audio codec 104 can be powered by current drawn from the telephone line.

Figure 6:
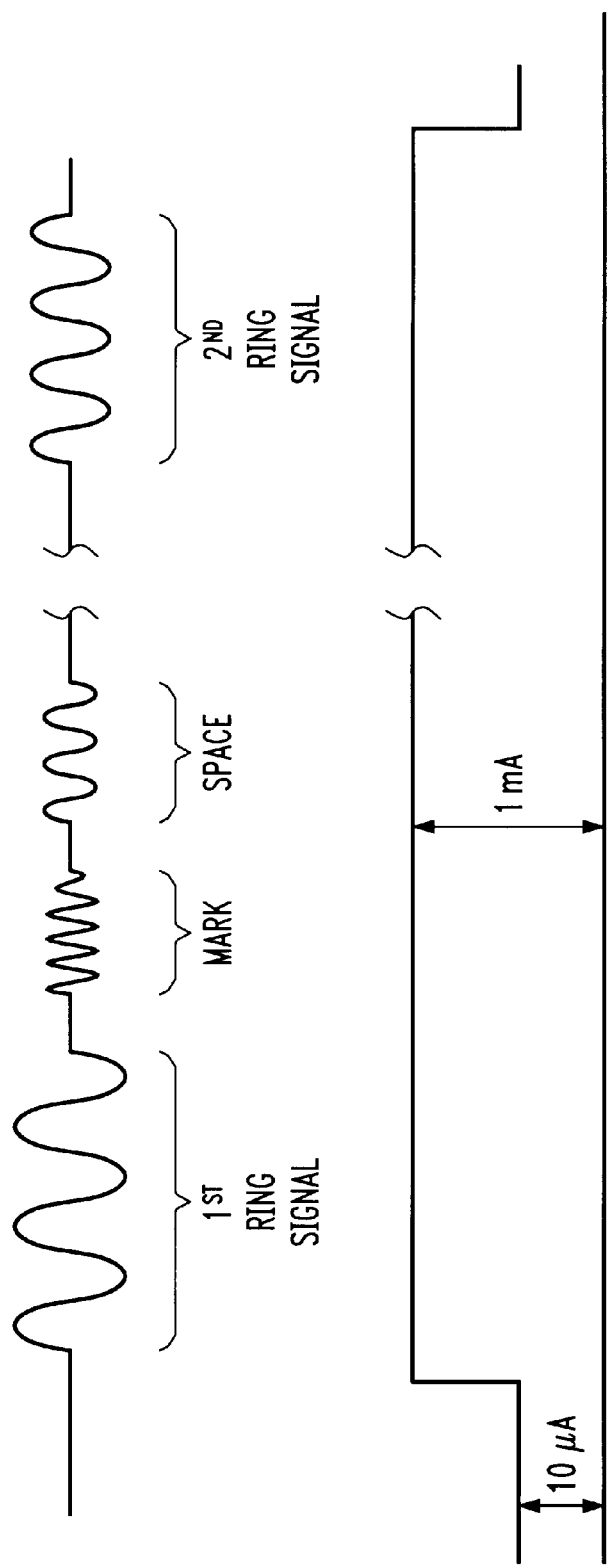
FIG. 6 is a timing diagram showing a conventional signal on a telephone line including Caller ID information transmitted to customer premises equipment between first and second ring signals, and of the approximate maximum allowed current usage by the receiving customer premises equipment in the United States during the interval between about the first and second ring signals.
Figure 7:
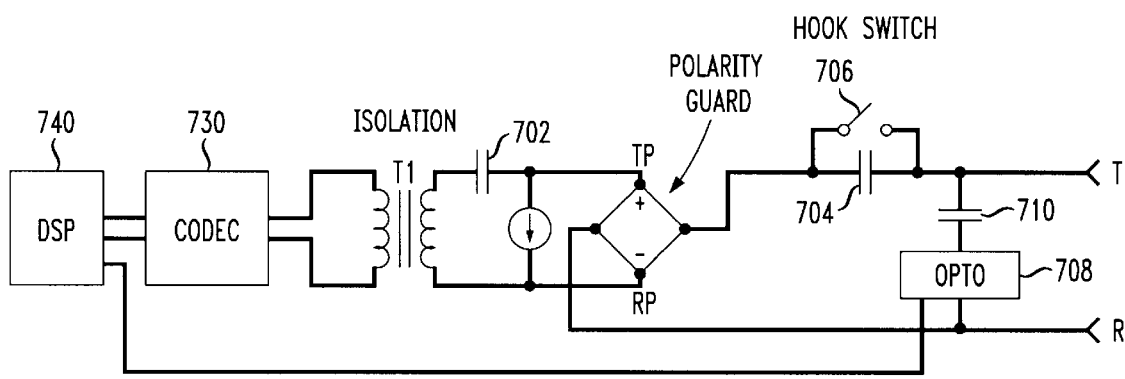
FIG. 7 is a conventional telephone circuit including a combined main signal path together with a signal path for call related information.
Figure 8:
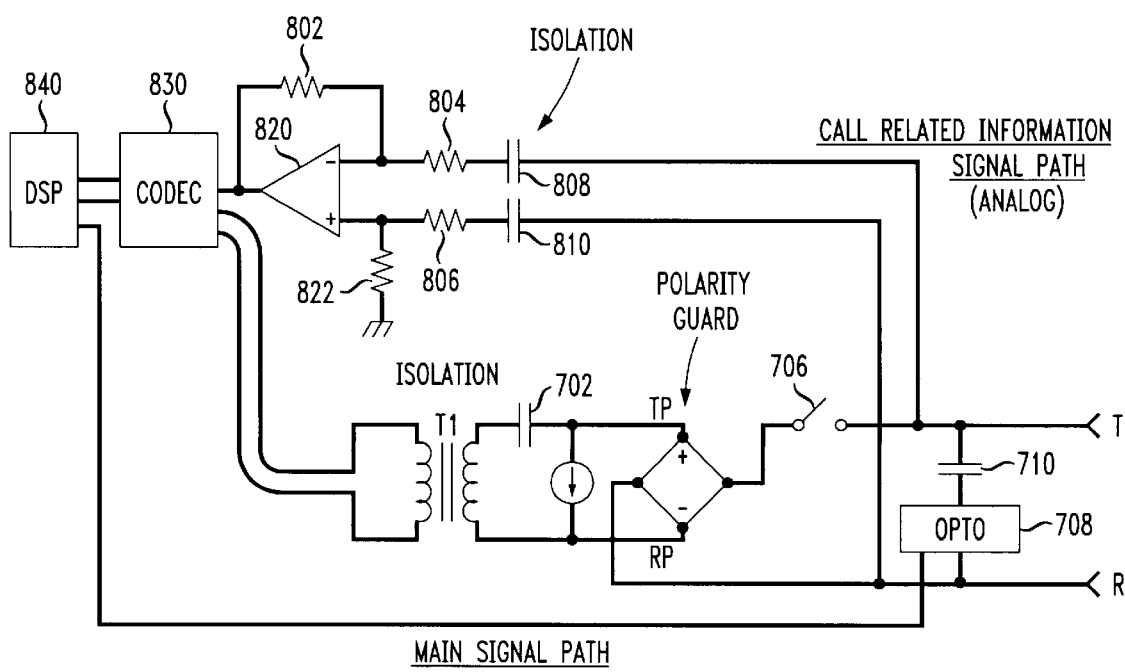
FIG. 8 is another conventional telephone circuit including separate analog signal paths, i.e., a main signal path and a call related information signal path.

In accordance with local telephone standards, the amount of current which the shunt regulator may draw is typically limited. For instance, as shown in waveform (b) of FIG. 6, an on-hook device may draw no more than, e.g., about 1 microamp (μA) of current based on current U.S. standards, except for during the time about between the first and second ring signals of an incoming call, at which time the on-hook device may draw more current, but no more than, e.g., about 1 milliamp (mA) based on current U.S. standards. It is important to note that while these current limits relate approximately to current U.S. telephone standards, any limits placed on power usage are anticipated and appropriate to the principles of the present invention. For instance, the present invention is equally applicable to any appropriate current limits, whether established based on standards for the country in which the customer premises equipment is used, or even no current limit at all.

Shunt regulators and other circuits for providing power to customer premises equipment from a telephone line are known. However, conventional audio codecs typically require current in excess of that allowable or desired to be drawn from a telephone line in an on-hook state. The embodiments of the present invention add selectable order to a Σ/Δ A/D converter in an audio codec to allow, e.g., reception of call related information processing, while being powered by a limited amount of current from a telephone line, i.e., within established limits.

Second and higher order Σ/Δ A/D converter devices are conventionally preferred in audio codecs, particularly those which conform largely to the AC '97 specification, to provide the higher S/N ratios required by the AC '97 specification. Thus, conventional audio codecs do not generally include a Σ/Δ A/D converter capable of $1^{st}$ order operation as does an audio codec in conformance with the principles of the present invention.

Figure 2:
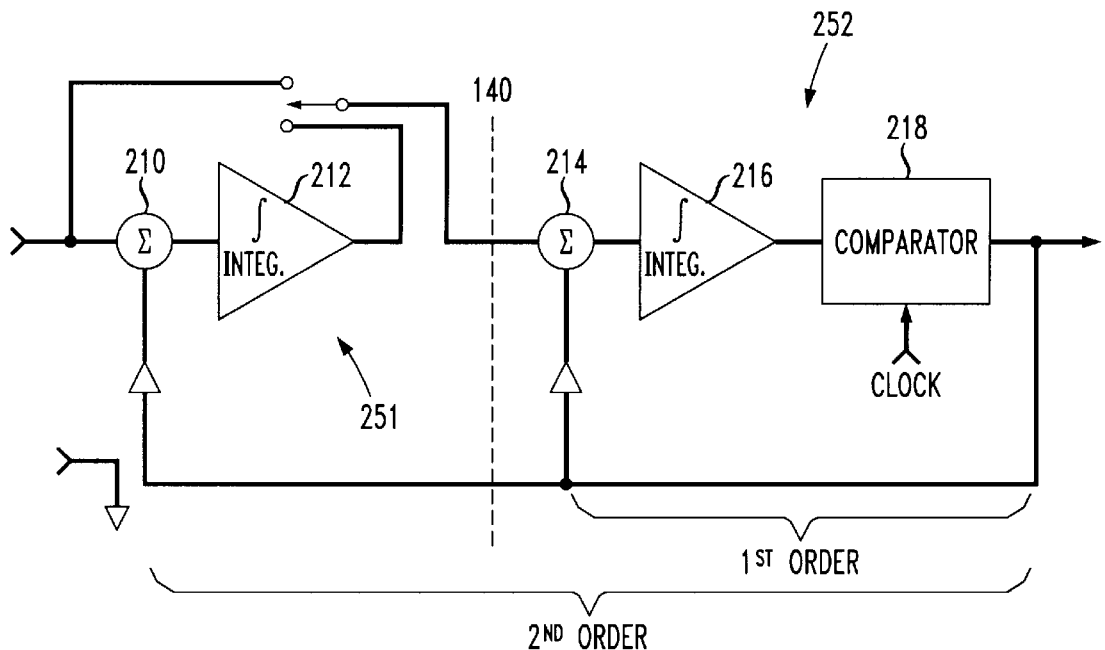
FIG. 2 depicts a selectable $1^{st}$ or $2^{nd}$ order $\Sigma/\Delta$ A/D converter in an audio codec of the telephone circuit shown in FIG. 1.
Figure 3:
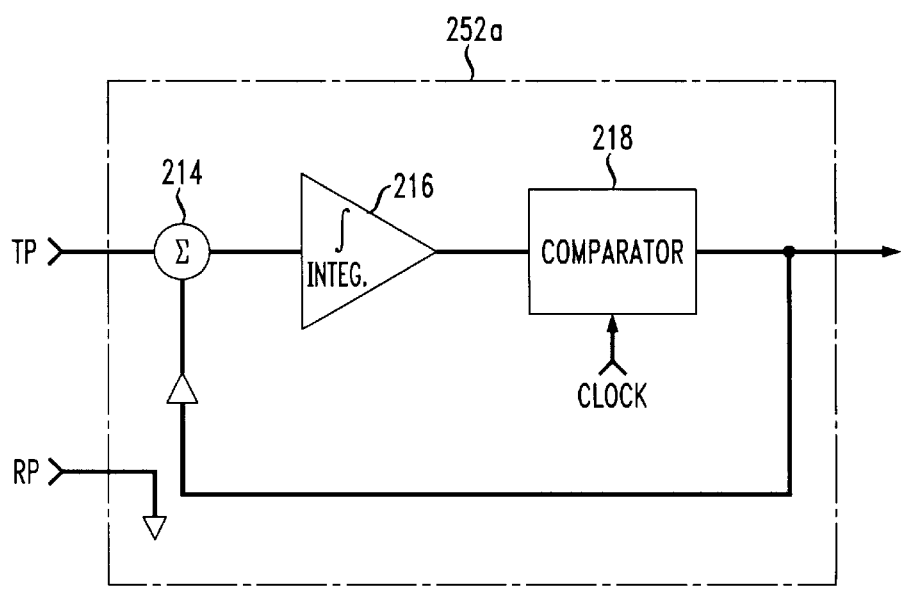
FIG. 3 shows the effective circuit of the first order $\Sigma/\Delta$ A/D converter of the audio codec shown in FIG. 2.

FIGS. 2 and 3 show the scaleable $2^{nd}$ order Σ/Δ A/D converter 140 (FIG. 1) in more detail.

In FIG. 2, the scaleable $1^{st}$ or $2^{nd}$ order Σ/Δ A/D converter 140 includes a first stage 251 and a second stage 252. The first stage 251 includes a summation element 210 and an integrator 212. The output of the first stage 251 is input to the second stage 252, which includes a summation element 214, an integrator 216, and a comparator 218. The output of the comparator 218 is fed back to both summing nodes 210, 214. The sampling rate of the scaleable $2^{nd}$ order Σ/Δ A/D converter 140 is based on the frequency of a sampling clock input to comparator 218.

The effective circuit of the scaleable Σ/Δ A/D converter 140 in the $1^{st}$ order mode is shown in FIG. 3. In FIG. 3, signals present on the tip and ring polarity signals TP, RP are converted into digital signals by a $1^{st}$ order Σ/Δ A/D converter formed by one stage 252a.

Second order Σ/Δ A/D converters are known. The present invention modifies an otherwise conventional audio codec such as those conforming to the AC '97 specification to include a scaleable Σ/Δ A/D converter 140 which comprises one stage, e.g., the second stage 252 of an otherwise conventional $2^{nd}$ order Σ/Δ A/D converter. This reduces the scaleable Σ/Δ A/D converter to be a $1^{st}$ order Σ/Δ A/D converter, and most importantly significantly reduces the power consumed by the audio codec including the scaleable Σ/Δ A/D converter 140 while the customer premises equipment is in an on-hook state.

Although the use of a $1^{st}$ order of a scaleable Σ/Δ A/D converter decreases the S/N ratio of the digitized signal output from the $1^{st}$ order Σ/Δ A/D converter, the resulting lowered S/N ratio is still nevertheless adequate to receive and decode the Caller ID information using digital signal processing. The use of a $1^{st}$ order Σ/Δ A/D converter reduces power consumption of the audio codec 104 while in an on-hook state, allowing isolation of the necessary portions of the audio codec 104, e.g., the Σ/Δ $1^{st}$ order AND converter 140, to be powered up and receive Caller ID information while the customer premises equipment is in an on-hook state.

Thus, an audio codec 104 in accordance with the principles of the present invention includes a $1^{st}$ order Σ/Δ A/D converter to receive and digitize the signal on the telephone line into single bit Σ/Δ samples.

Figure 4:
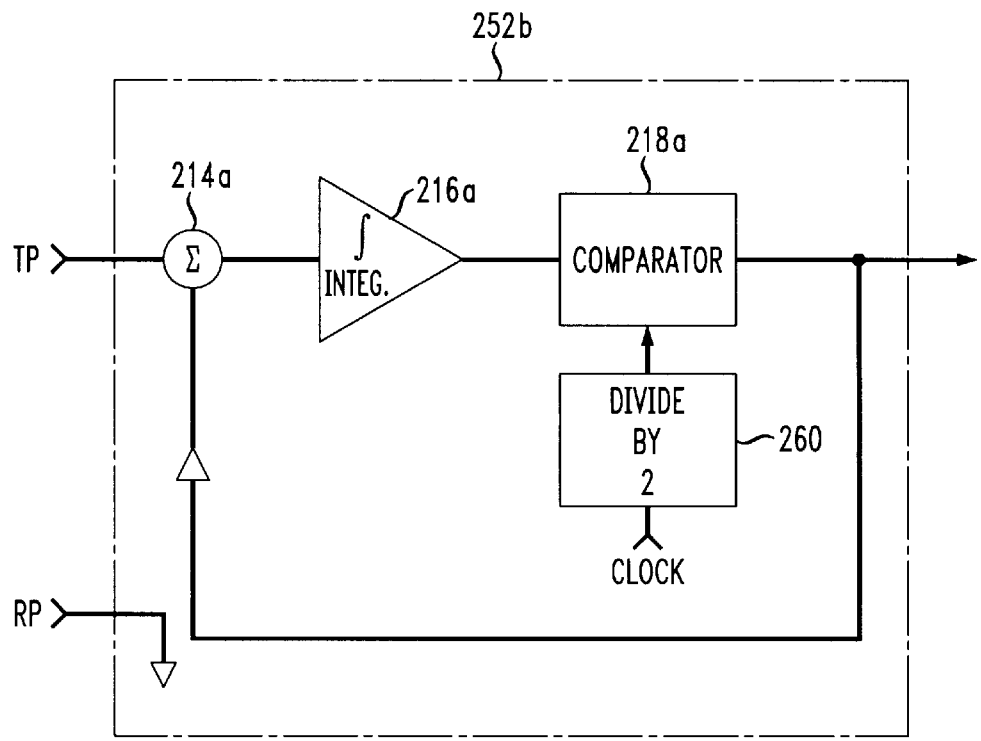
FIG. 4 shows another embodiment of the present invention including a $1^{st}$ order $\Sigma/\Delta$ A/D converter utilizing a clock divider to digitally convert the analog signal including the call related information at half the sampling rate of the higher order $2^{nd}$ order $\Sigma/\Delta$ A/D converter.

FIG. 4 shows relevant portions of a second embodiment of the present invention wherein the power consumption of a line-powered audio codec is further reduced. In FIG. 4, the scaleable audio codec 104 further includes a clock divider 260. The clock divider 260 divides the sampling clock by two. The comparator 218a of a $1^{st}$ order Σ/Δ A/D converter 252b in accordance with the second embodiment of the present invention is then sampled at half the sampling rate as compared to that used by the comparator 218 of the first embodiment. The slower sampling rate of the $1^{st}$ order Σ/Δ A/D converter 252b in the second embodiment adds substantially to a further decrease in the resulting S/N ratio, e.g. reduces it from about 85 decibels (dB) to about 30 dB, but nevertheless still provides a S/N ratio which is more than adequate for the accurate reception and digital processing of Caller ID information.

Other divisions other than two may be utilized in accordance with the principles of the present invention. Moreover, slower clocks may be generated from crystals or other sources, and not necessarily divided from a higher frequency clock, to provide the slower clock to the comparator 218a shown in FIG. 4.

Although U.S. standards allow as much as 1 mA of current to be drawn during the reception of Caller ID information, the present invention provides a scaleable audio codec 104 which can receive and decode Caller ID information using about 0.3 to 0.4 mA of current. When the scaleable audio codec 104 is performing functions other than receiving and demodulating Caller ID information, e.g., when providing the basis for a modem, it is powered either by the telephone line or from an external source.

Instead of a single A/D converter having two orders of operation, a separate $1^{st}$ order A/D converter may be provided to receive the call related information. In this case, the separate $1^{st}$ order A/D converter is configured as shown in FIG. 3.

Figure 9:
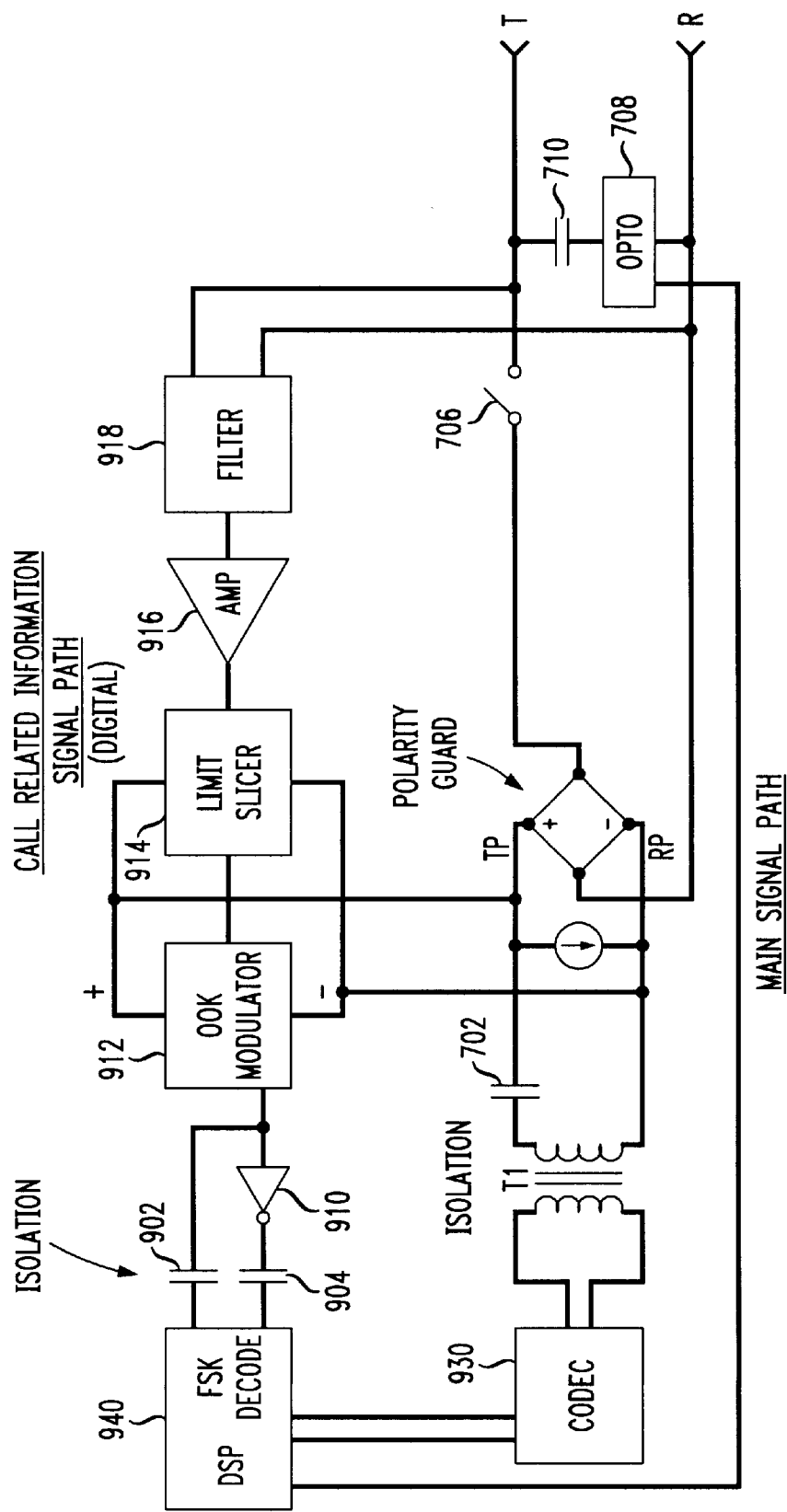
FIG. 9 is yet another conventional telephone circuit including a digital call related information signal path separate from an analog main signal path.

The scaleable audio codec 104 is in communication with a digital signal processor (DSP) 110 to perform digitally the substantial equivalent of the call related information signal path of the conventional circuit shown in FIG. 9.

Figure 5:
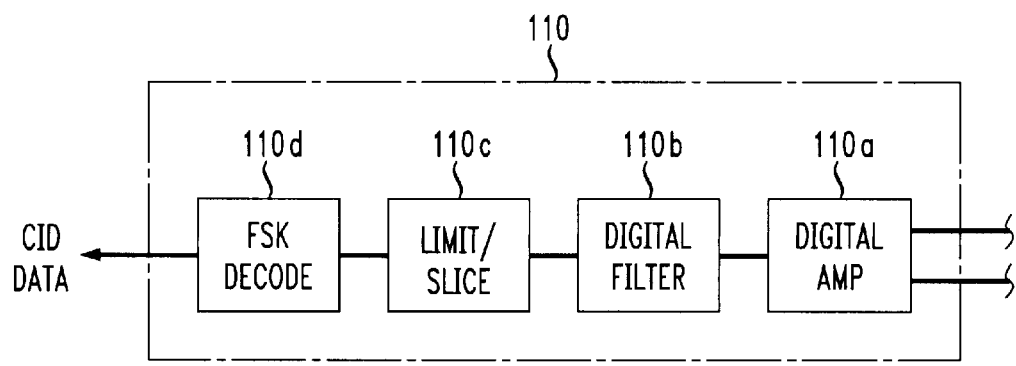
FIG. 5 shows the relevant portions of DSP of FIG. 1 in more detail.

In particular, as shown in FIG. 5, the DSP 110 receives the digital Σ/Δ encoded signal output from scaleable Σ/Δ A/D converter 140. The DSP 110 then digitally amplifies the signal if necessary in amplifier module 110a. The amplified signal is digitally filtered in digital filter 110b to isolate the call related information, e.g., the Caller ID information from the signal on the telephone line. The signal output from the digital filter 110b is input to a limit/slice module 110c, which limits and slices the filtered signal into portions for use by an FSK decoder 110d. The FSK decoder 110d decodes data in the signal and outputs the received call related information. The digital processes of amplification, filtering, limit/slicing and FSK decoding implemented in DSP 110 are well known in the art.

While the invention has been described with reference to the exemplary embodiments thereof, those skilled in the art will be able to make various modifications to the described embodiments of the invention without departing from the true spirit and scope of the invention.

We claim:

1. A device for receiving data from a telephone line in an on-hook condition, said device comprising:

a scaleable codec having a low power mode capable of operation with only power drawn from said telephone line in said on-hook condition, and having a high power mode capable of operation with power drawn from a source external to said telephone line in an off-hook condition.

2. The device for receiving data from a telephone line in an on-hook condition according to claim 1, wherein:

said scaleable codec is adapted and arranged to receive call related information in said on-hook condition.

3. The device for receiving data from a telephone line in an on-hook condition according to claim 2, wherein:

said call related information is caller ID information.

4. The device for receiving data from a telephone line in an on-hook condition according to claim 1, wherein said scaleable codec comprises:

an analog-to-digital converter having scaleable order.

5. The device for receiving data from a telephone line in an on-hook condition according to claim 4, wherein:

said analog-to-digital converter of said codec is adapted and arranged to operate in a $1^{st}$ order in said low power mode.

6. The device for receiving data from a telephone line in an on-hook condition according to claim 5, wherein:

said analog-to-digital converter of said codec is adapted and arranged to operate in a $2^{nd}$ order in said high power mode.

7. A method of receiving information from a telephone line, said method comprising:

digitizing in a scaleable codec call related information received from a telephone line in an on-hook condition using only power drawn from said telephone line in said on-hook condition; and converting in said scaleable codec an analog signal received from said telephone line in an off-hook condition.

8. The method of receiving information from a telephone line according to claim 7, wherein:

said step of digitizing comprises placing said scaleable codec in a low power mode; and said step of converting comprises placing said scaleable codec in a high power mode.

9. The method of receiving information from a telephone line according to claim 8, wherein said step of converting further comprises:

providing power from a source external to said telephone line in said off-hook condition to said scaleable codec.

10. The method of receiving information from a telephone line according to claim 7, wherein said step of digitizing comprises:

converting said call related information in a first order analog-to-digital converter in said scaleable codec.

11. The method of receiving information from a telephone line according to claim 10, wherein said step of converting comprises:

converting said analog signal in a second order analog-to-digital converter in said scaleable codec, said second order being higher than said first order.

12. A scaleable codec for receiving information from a telephone line, said scaleable codec comprising:

means for digitizing call related information received from a telephone line in an on-hook condition using only power drawn from said telephone line in said on-hook condition;

means for converting an analog signal received from said telephone line in an off-hook condition;

said means for digitizing call related information places said scaleable codec in a low power mode; and said means for converting comprises placing said scaleable code in a high power mode.

13. A device for receiving data from a telephone line, said device being adapted and arranged to be powered from current drawn from said telephone line in an on-hook state, said device comprising:

a first order sigma-delta analog-to-digital converter, part of a scaleable codec, adapted and arranged to convert an analog signal into digital samples;

a regulator to draw power for said scaleable codec from said telephone line in said on-hook state;

a digital filter to filter said digital samples output from said first order sigma-delta analog-to-digital converter; and a frequency shift keying decoder to decode a filtered signal from said digital filter, and to output decoded data.

14. The device according to claim 13, wherein:

said regulator draws power limited to a first power level during a time interval corresponding to a reception of said data while said telephone line is in said on-hook state, and limited to a higher second power level when said telephone line is in an off-hook state.

15. The device according to claim 14, wherein:

said first power level is about 1.0 mA.

16. The device according to claim 13, wherein:

said digital samples are single bit digital samples.

17. The device according to claim 13, further comprising:

a clock divider to divide a sampling clock to said first order sigma-delta analog-to-digital converter.

18. The device according to claim 13, further comprising:

a limit/slice module to digitize said filtered signal.

19. The device according to claim 13, further comprising:

a digital amplifier to amplify said analog signal from said telephone line.

20. The device according to claim 13, wherein:

said data corresponds to Caller ID information.

21. The device according to claim 13, wherein:

said first order sigma-delta analog-to-digital converter is adapted to operate on a line side of said device.

22. A method of receiving data from a telephone line in an on-hook state, comprising:

digitizing an analog signal from a telephone line using a $1^{st}$ order sigma-delta analog-to-digital converter which is part of a scaleable codec said scaleable codec using power drawn from said telephone line in said on-hook state; and digitally decoding said data from an output of said $1^{st}$ order sigma-delta analog-to-digital converter, using power drawn from said telephone line in said on-hook state.

23. The method of receiving data from said telephone line in said on-hook state according to claim 22, further comprising:

digitally filtering said data from said output of said $1^{st}$ order sigma-delta analog-to-digital converter, using power drawn from said telephone line in said on-hook state.

24. The method of receiving data from said telephone line in said on-hook state according to claim 22, wherein:

said digitizing produces single bit digital samples of said analog signal.

25. The method of receiving data from said telephone line in said on-hook state according to claim 22, further comprising:

dividing in half a sampling clock to said $1^{st}$ order sigma-delta analog-to-digital converter.

26. The method of receiving data from said telephone line in said on-hook state according to claim 22, further comprising:

regulating a voltage drawn from said telephone line in said on-hook state to provide said power.

27. The method of receiving data from said telephone line in said on-hook state according to claim 22, further comprising:

digitally amplifying said output of said $1^{st}$ order sigma-delta analog-to-digital converter, using said power drawn from said telephone line in said on-hook state.

28. The method of receiving data from said telephone line in said on-hook state according to claim 22, wherein:

said data corresponds to Caller ID information.

29. Apparatus to receive data from a telephone line in an on-hook state, comprising:

means for digitizing an analog signal from a telephone line using a $1^{st}$ order sigma-delta analog-to-digital converter which is part of a scaleable codec, said means for digitizing being powered by power drawn from said telephone line in said on-hook state; and means for digitally decoding said data from an output of said $1^{st}$ order sigma-delta analog-to-digital converter, said means for digitally decoding said data being powered by power drawn from said telephone line in said on-hook state.

30. The apparatus to receive data from said telephone line according to claim 29, wherein:

said means for digitizing is further for outputting single bit digital samples of said analog signal.

31. The apparatus to receive data from said telephone line according to claim 29, further comprising:

means for digitally filtering said data from said output of said $1^{st}$ order sigma-delta analog-to-digital converter, said means for digitally filtering using power drawn from said telephone line in said on-hook state.

32. The apparatus to receive data from said telephone line according to claim 29, further comprising:

means for dividing in half a sampling clock to said $1^{st}$ order sigma-delta analog-to-digital converter.

33. The apparatus to receive data from said telephone line according to claim 29, wherein:

said data corresponds to Caller ID information.

34. The apparatus to receive data from said telephone line according to claim 29, wherein:

said means for digitizing is adapted to operate on a line side of said device.

* * * * *